(12) United States Patent
Wu et al.

(10) Patent No.: US 12,142,868 B2
(45) Date of Patent: Nov. 12, 2024

(54) CHIP-FIXING DEVICE FOR A SOCKET

(71) Applicant: CHROMA ATE INC., Taoyuan (TW)

(72) Inventors: Hui-Jung Wu, Taoyuan (TW); Tsung-I Lin, Taoyuan (TW); Shou-Sheng Hsu, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 471 days.

(21) Appl. No.: 17/548,655

(22) Filed: Dec. 13, 2021

(65) Prior Publication Data

US 2022/0200185 A1 Jun. 23, 2022

(30) Foreign Application Priority Data

Dec. 18, 2020 (TW) .................................. 109144895

(51) Int. Cl.
*H01R 13/24* (2006.01)
*G01R 1/04* (2006.01)
*H05K 7/10* (2006.01)

(52) U.S. Cl.
CPC ....... *H01R 13/2421* (2013.01); *G01R 1/0408* (2013.01); *H05K 7/1069* (2013.01)

(58) Field of Classification Search
CPC ................ H01R 13/2421; H01R 33/76; H01R 13/2442; G01R 1/0408; G01R 1/0466; G01R 1/0483; H05K 7/1069
See application file for complete search history.

(56) References Cited

U.S. PATENT DOCUMENTS

| | | |
|---|---|---|
| 2002/0177347 A1 | 11/2002 | Ogura |
| 2008/0186046 A1 | 8/2008 | Yun et al. |
| 2008/0261457 A1* | 10/2008 | Kobayashi ........... G01R 1/0466 439/683 |

(Continued)

FOREIGN PATENT DOCUMENTS

| | | |
|---|---|---|
| CN | 105324672 A | 2/2016 |
| CN | 111208323 A | 5/2020 |

(Continued)

OTHER PUBLICATIONS

JP Office Action dated Dec. 13, 2022 in Japanese application No. 2021-204896.

(Continued)

*Primary Examiner* — Michael C Zarroli
(74) *Attorney, Agent, or Firm* — McClure, Qualey & Rodack, LLP

(57) ABSTRACT

The present invention relates to a chip-fixing device for a socket, which comprises a fixing base body and a movable stop. The socket is assembled in a socket-accommodating recess of the fixing base body. The movable stop is assembled in the fixing base body and controlled in such a manner that a stopper is moved between a first position and a second position, wherein the first position refers to a position where the stopper is located right above the socket, and the second position refers to a position where the stopper is not located right above the socket. Accordingly, the socket-accommodating recess can be used to install sockets of different sizes, and the movable stop can drive the stopper to restrict a chip from falling off the socket or drive the stopper to release the chip, depending on presence or absence of an external force.

7 Claims, 3 Drawing Sheets

(56) References Cited

U.S. PATENT DOCUMENTS

2015/0377924 A1  12/2015  Hwang et al.
2017/0045551 A1   2/2017  Hwang et al.

FOREIGN PATENT DOCUMENTS

TW   201830022 A    8/2018
TW   202027346 A    7/2020
WO   2010004844 A1  1/2010

OTHER PUBLICATIONS

TW Office Action dated Sep. 30, 2021 in Taiwan application No. 109144895.
Search Report issued in TW Office Action dated Sep. 30, 2021 in Taiwan application No. 109144895.

* cited by examiner

CHIP-FIXING DEVICE FOR A SOCKET

BACKGROUND OF THE INVENTION

Field of the Invention

The present invention relates to a chip-fixing device for a socket, in particular to a chip-fixing device for a socket which can prevent a chip to be tested from falling off the socket when the chip to be tested is transferred along with the socket.

Description of the Related Art

A traditional socket of a chip test equipment is positioned on a test substrate, and a pressing head must be used to press a chip to be tested during the test to ensure that the chip to be tested can completely contact the probes in the socket, and the pressing head must continue to press the chip to be tested during the entire test process. In fact, the group of the fixed socket and the pressing head occupies a considerable space, and the number of the groups of the fixed socket and the pressing head which can be disposed in a single large test equipment is still limited.

In order to overcome the problem of machine space, existing test equipment manufacturers are working hard to develop a socket which can be three-dimensionally arranged. That is, when sockets are loaded with chips to be tested, the sockets can be transferred to a specific position or be placed in a stack manner and then undergo a burn-in test. The stability of the chip to be tested in the socket during the transfer process of the socket would be challenged.

A related socket on which latches are arranged to compress an IC in the socket is disclosed in US Patent Publication No. US2002/0177347A1 entitled "Socket for IC package". In other words, according to this patent document, only the dedicated socket is equipped with the latches, and the latches cannot be used for other sockets. Furthermore, the socket of this patent application works in such a manner that the front-end inclined surface of the latch is pressed by a T-shaped spring support member, causing the front-end projection of the latch to slide along a tilted surface and abut against the IC.

However, according to this configuration, in either of the case that the T-shaped spring support member pushes the latch and the case that the front-end projection of the latch slides along the tilted surface, scraps which may contaminate the IC or the socket would be generated under surface friction for a long time. According to the disclosure of the drawings of this patent document, interference may easily occur due to the manner of pushing the latch by the T-shaped spring support member, and it may be difficult that the socket is operated smoothly.

SUMMARY OF THE INVENTION

The main object of the present invention is to provide a chip-fixing device fora socket, which can effectively prevent a chip to be tested from falling off the socket when the chip to be tested is transferred along with the socket and can be arbitrarily matched with various types of sockets and chips having different specifications and sizes.

In order to achieve the above-mentioned object, a chip-fixing device for a socket of the present invention is arranged on the socket, which includes a chip slot for accommodating a chip to be tested. The chip-fixing device of the present invention mainly comprises a fixing base body and at least one movable stop. The fixing base body includes a through opening and a socket-accommodating recess. The socket is mounted in the socket-accommodating recess, and the chip slot of the socket corresponds to the through opening and is exposed from an upper surface of the fixing base body. Each movable stop includes a stopper and is mounted in the fixing base body and controlled in such a manner that the stopper is moved between a first position and a second position, wherein the first position refers to a position where the stopper is located right above the chip slot of the socket during a non-testing period, and the second position refers to a position where the stopper is not located right above the chip slot of the socket during a testing period; wherein when the stopper is located at the first position, a distance between the stopper and an upper surface of the chip to be tested is smaller than a depth of the chip slot of the socket.

Accordingly, the socket-accommodating recess of the present invention can be used to install various types of sockets having different specifications and sizes, and the movable stop can drive the stopper to the position right above the chip slot of the socket during a non-testing period so as to prevent a chip to be tested from falling off the chip slot or drive the stopper to move away from the position right above the chip slot of the socket during a testing period, depending on presence or absence of an external force.

In order to achieve the above-mentioned object, a chip-fixing device for a socket of the present invention is arranged on the socket, which includes a chip slot for accommodating a chip to be tested. The chip-fixing device of the present invention mainly comprises a fixing base body and two movable stops. The fixing base body includes a through opening and a socket-accommodating recess. The socket is mounted in the socket-accommodating recess, and the chip slot of the socket corresponds to the through opening and is exposed from an upper surface of the fixing base body. The two movable stops are arranged in the through opening and correspond to two opposite sides of the chip slot of the socket respectively. Each movable stop includes a stopper, and the two movable stops are controlled in such a manner that the stoppers are moved between a first position and a second position, wherein the first position refers to a position where the stoppers of the two movable stops are located on two opposite sides right above the chip to be tested respectively during a non-testing period so that the chip to be tested is unable to depart from the chip slot, and the second position refers to a position where the stoppers are not located right above the chip slot of the socket during a testing period so that the chip to be tested is able to depart from the chip slot; wherein when the stopper is located at the first position, a distance between the stopper and an upper surface of the chip to be tested is smaller than a depth of the chip slot of the socket.

Another aspect of the chip-fixing device of the present invention is not only provided with the socket-accommodating recess for installing various types of sockets having different specifications and sizes, but also additionally provided with the two movable stops on the two opposite sides of the chip slot of the socket, which can clamp the chip to be tested from two sides of the chip so as to better ensure that the chip to be tested would not fall off the socket.

In order to achieve the above-mentioned objective, a chip-fixing device for a socket of the present invention is arranged on the socket, which includes a chip slot for accommodating a chip to be tested. The chip-fixing device of the present invention mainly comprises a fixing base body, two movable stops, two pairs of rocker arms, two first connection rods, and two second connection rods. The fixing base body includes a socket-accommodating recess, a through opening, four arm-accommodating recesses, two first elongated holes, and two second elongated holes. The through opening and the arm-accommodating recesses penetrate an upper surface and a lower surface of the fixing base body. The socket is mounted in the socket-accommodating recess, and the chip slot of the socket corresponds to the through opening and is exposed from the upper surface of the fixing base body. The four arm-accommodating recesses are provided on four corners of the through opening respectively. The two first elongated holes and the two second elongated holes penetrate two side end surfaces of the fixing base body and are located on two sides of the socket respectively. The two movable stops are arranged in the through opening and correspond to two opposite sides of the chip slot of the socket respectively. Each movable stop includes a stopper. The two movable stops are mounted in the fixing base body and controlled in such a manner that the stoppers are moved between a first position and a second position. The two pairs of rocker arms are arranged on two sides of the two movable stops and accommodated in the four arm-accommodating recesses respectively, and each rocker arm includes a fixed end and a movable end. Each first connection rod extends through the respective first elongated hole and pivotally connected to the fixed ends of the respective rocker arm and the respective movable stop, and each second connection rod extends through the respective second elongated hole and pivotally connected to the respective movable stop. The second position refers to a position where the movable ends of the two pairs of rocker arms are pushed by an external force during a testing period so that the rocker arms drive the movable stops to move the stoppers not to be located right above the chip slot of the socket, and the first position refers to a position where the external force is cancelled so that the stoppers are located right above the chip slot of the socket during a non-testing period; wherein when the stopper is located at the first position, a distance between the stopper and an upper surface of the chip to be tested is smaller than a depth of the chip slot of the socket.

Another aspect of the chip-fixing device of the present invention is provided with the socket-accommodating recess for installing various types of sockets having different specifications and sizes. In addition, the rocker arms are used to move the movable stops between the first position and the second position. When the rocker arms are driven by an external force (for example, the rocker arms are pressed by the test head), the rocker arms drive the movable stops to move the stoppers away from the position right above the chip slot of the socket so that the test head contacts the chip to be tested in the chip slot. On the other hand, when the external force is cancelled, that is, when the test head moves away from the rocker arms, the stoppers returns to the position right above the chip slot of the socket to prevent the chip from falling off the chip slot.

DESCRIPTION OF THE PREFERRED EMBODIMENTS

Figure 1:
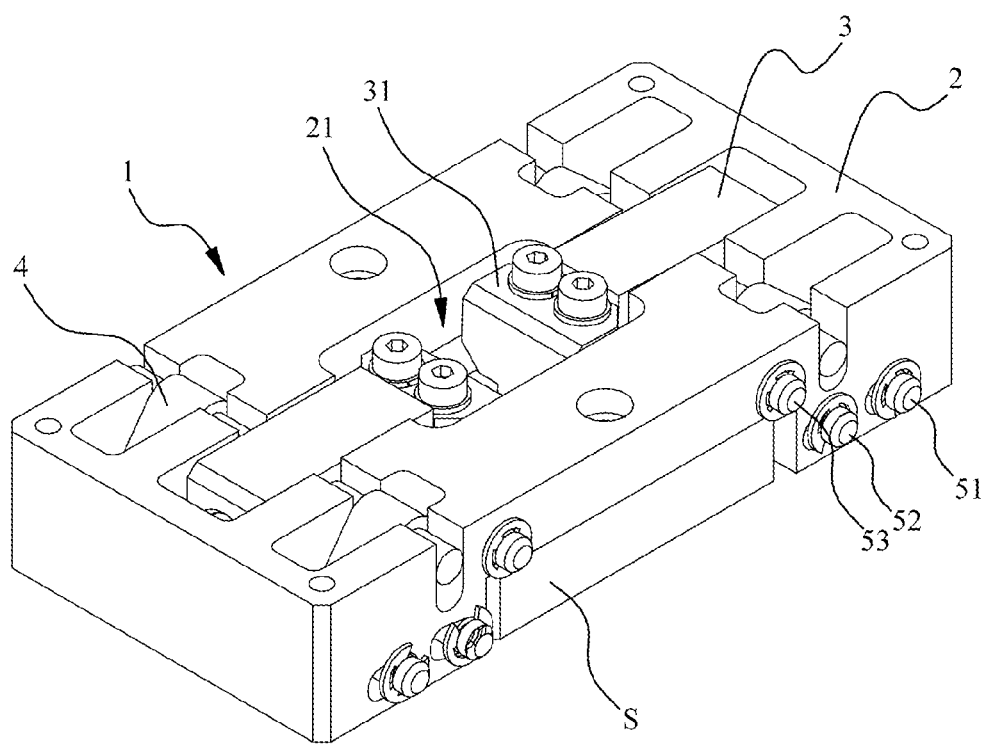
FIG. 1 is a perspective view of a chip-fixing device for a socket of the present invention.

Before a chip-fixing device for a socket of the present invention is described in detail in this embodiment, it should be particularly noted that in the following description, similar components will be designated by the same numeral reference. Furthermore, the drawings of the present invention are only for illustrative purposes and are not necessarily drawn to scale, and not all details are necessarily presented in the drawings.

Figure 2:
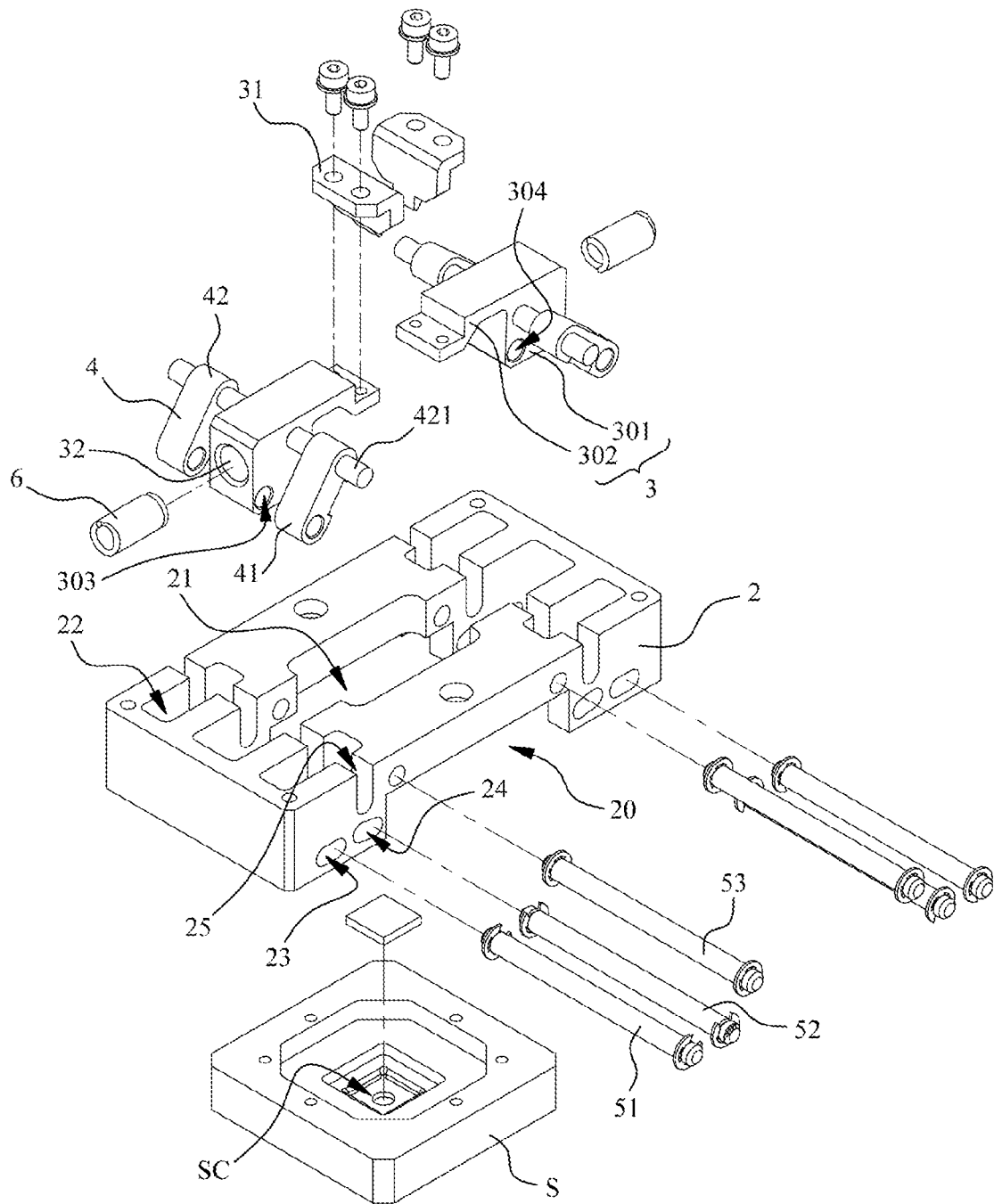
FIG. 2 is an exploded view of the chip-fixing device for a socket of the present invention.

Reference is made to FIGS. 1 and 2. FIG. 1 is a perspective view of the chip-fixing device for a socket of the present invention, and FIG. 2 is an exploded view of the chip-fixing device for a socket of the present invention. As shown in the figures, the chip-fixing device 1 for a socket of this embodiment can be regarded as a socket plate, which can be matched with sockets S having any specification and size. Specifically, the chip-fixing device 1 for a socket of this embodiment mainly includes a fixing base body 2, two movable stops 3, two pairs of rocker arms 4, two first connection rods 51, two second connection rods 52, two third connection rods 53, and two restoring springs 6.

The fixing base body 2 includes a socket-accommodating recess 20, a through opening 21, four arm-accommodating recesses 22, two first elongated holes 23, and two second elongated holes 24, wherein the through opening 21 and the arm-accommodating recesses 22 penetrate the upper and lower surfaces of the fixing base body 2; the socket-accommodating recess 20 can be used to install various sockets S; and the chip slot SC of the socket S corresponds to the through opening 21 and is exposed from the upper surface of the fixing base body 2. The four arm-accommodating recesses 22 are provided on the four corners of the through opening 21 respectively, and both sides of each arm-accommodating recess 22 are each provided with a vertical guiding recess 25 communicated with the arm-accommodating recess 22.

On the other hand, the two first elongated holes 23 and the two second elongated holes 24 penetrate the front and rear end surfaces of the fixing base body 2 and are located on two sides of the socket S, wherein the first elongated hole 23 is a horizontal elongated hole, and the second elongated hole 24 is an oblique elongated hole, one end of which adjacent to the first elongated hole 23 extends toward the upper surface of the fixing base body 2.

The two movable stops 3 are disposed in the through opening 21 and correspond to two sides of the chip slot SC of the socket S respectively, and each movable stop 3 includes a stopper 31. Each movable stop 3 includes a body portion 301 and a cantilever portion 302. The body portion 301 is formed with two through holes 303, 304. A free end of each cantilever portion 302 of the two movable stops 3 is provided with the stopper 31.

Two rocker arms 4 are arranged on both sides of each movable stop 3 respectively, that is, the two pairs of rocker arms 4 are arranged in the four arm-accommodating recesses 22, wherein each rocker arm 4 includes a fixed end 41 and a movable end 42. Each movable end 42 is provided with a guided protrusion 421 on each side face thereof. The guided protrusions 421 are accommodated in the vertical guiding recesses 25 on both sides of the arm-accommodating recess 22 and can be guided by the vertical guiding recesses 25 and moved upwardly or downwardly.

The two first connection rods 51 extend through the first elongated holes 23 on the two sides of the fixing base body 2 respectively and are pivotally connected to the fixed ends 41 of the rocker arms 4 and the through holes 303 of the movable stops 3, and the two second connection rods 52 extends through the second elongated holes 24 on the two sides of the fixing base body 2 respectively and are pivotally connected to the other through holes 304 of the movable stops 3 adjacent to the socket-accommodating recess 20. The two third connection rods 53 are mounted in the fixing base body 2 and located on the two sides of the socket S under the cantilever portions 302 of the movable stops 3.

The body portion 301 of each movable stop 3 is provided with an accommodating recess 32 on the side away from the cantilever portion 302 for accommodating a restoring spring 6. That is, the restoring spring 6 is arranged in the through opening 21 and located between the fixing base body 2 and the movable stop 3.

Figure 3:
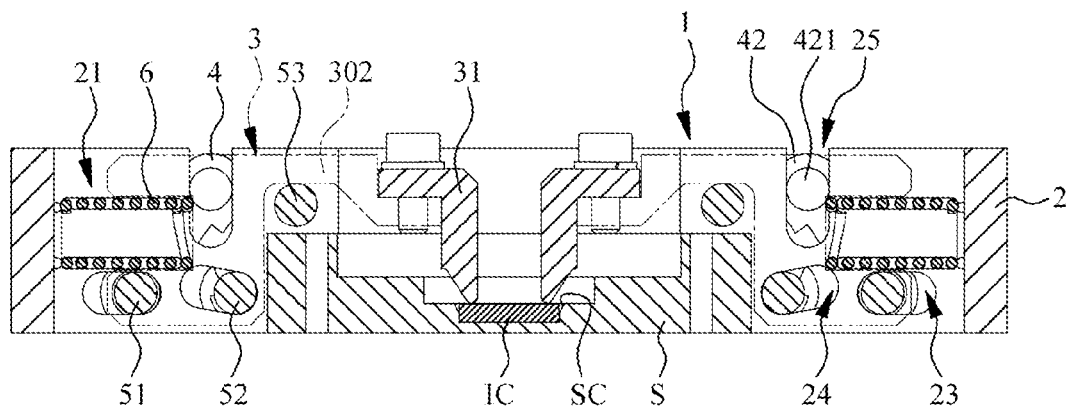
FIG. 3 is a cross-sectional view of the chip-fixing device for a socket of the present invention with stoppers being located at a first position.

Reference is made to FIG. 3, which is a cross-sectional view of the chip-fixing device 1 for a socket of the present invention with the stoppers 31 being located at a first position. FIG. 3 is a cross-sectional view showing a normal state in which the chip-fixing device 1 for a socket together with the socket S is to be transferred after the socket S is loaded with a chip IC to be tested. As shown in the figure, the restoring spring 6 biases the body portion 301 of the movable stop 3 toward the socket S so that the body portion 301 is abutted against a side end surface of the socket S.

At this time, the guided protrusions 421 of the movable end 42 of the rocker arm 4 are located in the vertical guiding recesses 25 and close to the upper surface of the fixing base body 2. The first connection rod 51 and the second connection rod 52 located in the first elongated hole 23 and the second elongated hole 24 respectively are close to one side of the socket S. The lower surface of the cantilever portion 302 of the movable stop 3 is abutted against the third connection rod 53. More specifically, at this time, the stopper 31 is located right above the chip slot SC of the socket S to prevent the chip IC to be tested from falling off the chip slot SC.

It should be particularly noted that, in this embodiment, when the stopper 31 is located at the first position, the distance between the stopper 31 and the upper surface of the chip IC to be tested is smaller than the depth of the chip slot SC of the socket S, that is to say, the end of the stopper 31 is spaced from the upper surface of the chip IC to be tested by a clearance and is not in contact with the upper surface of the chip IC to be tested. As such, the stopper 31 is prevented from scratching the surface of the chip IC to be tested.

Figure 4:
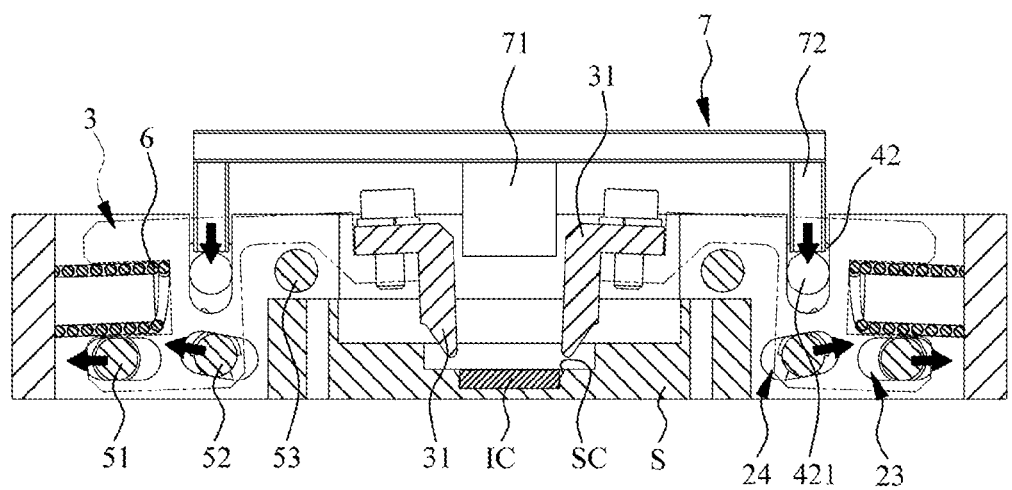
FIG. 4 is a cross-sectional view of the chip-fixing device for a socket of the present invention with stoppers being located at a second position.

Reference is made to FIG. 4, which is a cross-sectional view of the chip-fixing device 1 for a socket of the present invention with the stoppers 31 being located at a second position. As shown in the figure, the pressing head 7 of this embodiment includes a test head 71 and four pressing rods 72, wherein the test head 71 corresponds to the chip slot SC of the socket S, that is, corresponds to the chip IC to be tested, and the four depressing rods 72 correspond to the movable ends 42 of the rocker arms 4 in the four arm-accommodating recesses 22 respectively.

In the case of performing a test operation, the pressing head 7 is lowered, and the movable ends 42 of the rocker arms 4 are pressed by the pressing rods 72 exerting a pressing force thereon so that the movable stop 3 is displaced. With aid of guidance of the first connection rods 51 and the second connection rods 52 in the first elongated holes 23 and the second elongated holes 24, the rocker arms 4 drive the movable stops 3 to move the stoppers 31 away from the position right above the chip slot SC of the socket S. The movable stops 3 is guided by the first elongated holes 23 so as to be displaced in a horizontal direction away from the socket S. The movable stops 3 is guided by the second elongated holes 24 so as to be displaced in an oblique and upward direction away from the socket S so that the stoppers 31 located above the socket S are moved away from the position right above the chip slot SC completely, and the test head 71 can be lowered to be in contact with the chip IC to be tested.

If the test is completed, the pressing head 7 is raised, the test head 71 is retracted from the chip IC, and the four depressing rods 72 are gradually raised, that is, the pressing force is cancelled. At this time, the movable stops 3 are biased to the first position shown in FIG. 3 by the biasing forces of the restoring springs 6. In other words, the stoppers 31 return to the position right above the chip slot SC of the socket S, to prevent the chip IC from falling off the chip slot SC. On the other hand, when the chip is to be picked and placed, a pick-and-place mechanism (not shown) is provided with pressing rods, and the movable stops 3 are moved away from the position right above the chip slot SC in the same manner. This facilitates the pick-and-place mechanism to remove the tested chip and to place another chip to be tested.

In summary, compared with the prior art, the chip-fixing device for a socket of the present invention has at least the following advantages:

(1) the chip-fixing device of the present invention is an independent component, which can be arbitrarily combined with various types of sockets having different specifications and sizes and can be reused, and there is no need to redesign and replace and reinstall the chip-fixing device corresponding to various types of chips to be tested or sockets;

(2) the chip-fixing device of the present invention has a simple structure, is easy in assembling and maintenance, durable and stable and is capable of effectively preventing the chip to be tested from falling off the chip slot of the socket during the transfer process;

(3) the stoppers are not in direct contact with the chip to be tested and hence is prevented from scratching the chip to be tested;

(4) in the case that the chip to be tested has a different thickness, only the stoppers need to be replaced to match the chip having a different thickness; and (5) the chip-fixing device of the present invention has no need to be equipped with an additional actuator, and the existing test equipment has no need to be greatly modified; and additionally mounting the pressing rods on the pressing head of the existing test equipment allows the chip to be tested in the socket to be fixed or released in the existing operation mode.

The preferred embodiment of the present invention is illustrative only, and the claimed inventions are not limited to the details disclosed in the drawings and the specification. Accordingly, it is intended that it have the full scope permitted by the language of the following claims.

What is claimed is:

1. A chip-fixing device for a socket, arranged on the socket, the socket including a chip slot for accommodating a chip to be tested, the chip-fixing device comprising:

a fixing base body, including a through opening and a socket-accommodating recess, the socket being assembled in the socket-accommodating recess, the chip slot of the socket corresponding to the through opening and being exposed from an upper surface of the fixing base body;

at least one movable stop, each movable stop including a stopper, the at least one movable stop being assembled in the fixing base body and controlled in such a manner that the stopper is moved between a first position and a second position, at least one rocker arm, at least one first connection rod, and at least one second connection rod; the fixing base body including at least one arm-accommodating recess, at least one first elongated hole, and at least one second elongated hole, wherein the at least one rocker arm is accommodated in the at least one arm-accommodating recess; the at least one first connection rod extends through the at least one first elongated hole and is pivotally connected to one end of the at least one rocker arm and the at least one movable stop; the at least one second connection rod extends through the at least one second elongated hole and is pivotally connected to the at least one movable stop;

wherein the first position refers to a position where the stopper is located right above the chip slot of the socket during a non-testing period, and the second position refers to a position where the stopper is not located right above the chip slot of the socket during a testing period;

wherein when the stopper is located at the first position, a distance between the stopper and an upper surface of the chip to be tested is smaller than a depth of the chip slot of the socket.

2. The chip-fixing device of claim 1, wherein the at least one first elongated hole is a horizontal elongated hole, the at least one second elongated hole is an oblique elongated hole, and one end of the at least one second elongated hole adjacent to the at least one first elongated hole extends toward the upper surface of the fixing base body.

3. The chip-fixing device of claim 1, wherein the fixing base body further includes a vertical guiding recess, which communicates with the at least one arm-accommodating recess; the at least one rocker arm includes a fixed end and a movable end; the at least one first connection rod is pivotally connected to the fixed end; the movable end is provided with a guided protrusion, which is accommodated in the vertical guiding recess and is guided by the vertical guiding recess and moved upwardly or downwardly.

4. The chip-fixing device of claim 3, further comprising at least one restoring spring, which is arranged between the fixing base body and the at least one movable stop and applies a biasing force to drive the stopper to move toward the first position.

5. The chip-fixing device of claim 1, wherein the at least one movable stop includes a body portion and a cantilever portion, the body portion is formed with two through holes, and the at least one first connection rod and the at least one second connection rod are pivotally connected to the two through holes respectively; the stopper is assembled on the cantilever portion.

6. The chip-fixing device of claim 5, further comprising a third connection rod, wherein the third connection rod is assembled in the fixing base body; when the stopper is located at the first position, a lower surface of the cantilever portion of the at least one movable stop abuts against the third connection rod.

7. A chip-fixing device for a socket, arranged on the socket, the socket including a chip slot for accommodating a chip to be tested, the chip-fixing device comprising:

a fixing base body, including a socket-accommodating recess, a through opening, four arm-accommodating recesses, two first elongated holes, and two second elongated holes; the through opening and the arm-accommodating recesses penetrating an upper surface and a lower surface of the fixing base body; the socket being assembled in the socket-accommodating recess; the chip slot of the socket corresponding to the through opening and being exposed from the upper surface of the fixing base body; the four arm-accommodating recesses being arranged on four corners of the through opening respectively; the two first elongated holes and the two second elongated holes penetrating two side end surfaces of the fixing base body and located on two sides of the socket respectively;

two movable stops, arranged in the through opening and corresponding to two opposite sides of the chip slot of the socket respectively, each movable stop including a stopper, and the two movable stops being controlled in such a manner that the stoppers are moved between a first position and a second position;

two pairs of rocker arms, arranged on two sides of the two movable stops respectively and accommodated in the four arm-accommodating recesses, each rocker arm including a fixed end and a movable end; and two first connection rods and two second connection rods, each first connection rod extending through the respective first elongated hole and being pivotally connected to the fixed ends of the respective rocker arms and the respective movable stop, and each second connection rod extending through the respective second elongated hole and being pivotally connected to the respective movable stop, wherein the second position refers to a position where the movable ends of the two pairs of rocker arms are pushed by an external force during a testing period so that the rocker arms drive the movable stops to move the stoppers not to be located right above the chip slot of the socket, and the first position refers to a position where the external force is cancelled during a non-testing period so that the stoppers are located right above the chip slot of the socket;

wherein when the stopper is located at the first position, a distance between the stopper and an upper surface of the chip to be tested is smaller than a depth of the chip slot of the socket.

* * * * *